(12) United States Patent
Gervedink Nijhuis et al.

(10) Patent No.: US 11,268,979 B2
(45) Date of Patent: Mar. 8, 2022

(54) USER INTERFACE FOR A TESTING DEVICE CONFIGURED TO GUIDE USER TESTING OF A MOTOR DRIVE AND A MOTOR

(71) Applicant: Fluke Corporation, Everett, WA (US)

(72) Inventors: Erik Johan Gervedink Nijhuis, Hengelo (NL); Zhaoyi Fang, Surrey (CA)

(73) Assignee: Fluke Corporation, Everett, WA (US)

( * ) Notice: Subject to any disclaimer, the term of this patent is extended or adjusted under 35 U.S.C. 154(b) by 248 days.

(21) Appl. No.: 16/436,654

(22) Filed: Jun. 10, 2019

(65) Prior Publication Data

US 2019/0376999 A1 Dec. 12, 2019

Related U.S. Application Data

(60) Provisional application No. 62/683,585, filed on Jun. 11, 2018.

(51) Int. Cl.
*G01R 1/02* (2006.01)
*G01R 13/22* (2006.01)
*G01R 31/34* (2020.01)

(52) U.S. Cl.
CPC .......... *G01R 1/025* (2013.01); *G01R 13/225* (2013.01); *G01R 31/343* (2013.01)

(58) Field of Classification Search
CPC .... G01R 1/025; G01R 13/225; G01R 13/029; G01R 31/343; G01R 31/34
See application file for complete search history.

(56) References Cited

U.S. PATENT DOCUMENTS 5,270,961 A * 12/1993 Bajat .................. H02P 8/18
708/3

OTHER PUBLICATIONS

IEEE_Xplore_Search_Results, Feb. 24, 2021, 1 pp. (Year: 2021).*
Duffie et al., Development of a Menu-Driven Programmable System of Machinery Drives, 1983, Annals of the CIRP, vol. 32, Issue 1, pp. 281-285 (Year: 1983).*

* cited by examiner

*Primary Examiner* — Toan M Le
(74) *Attorney, Agent, or Firm* — Seed IP Law Group LLP

(57) ABSTRACT

A testing device configured to operate as a dedicated tool for testing motor drives and motor shafts guides a user (such as a test engineer or a technician) through the steps of testing the motor drive and shaft. The testing device is configured to output testing results to the user. By configuring the testing device to output specific motor drive and shaft measurement results and by guiding a user through the steps of performing the measurement, operation of the testing device is simplified.

15 Claims, 15 Drawing Sheets

(D:) > FLUKE > STORE > FLUKE1

| Name | Date modified | Type | Size |
|---|---|---|---|
| DCVDC01.PNG | 24-May-18 5:15 PM | PNG image | 3 KB |
| DCVPPL01.PNG | 24-May-18 5:15 PM | PNG image | 3 KB |
| FLUKE_PV | 24-May-18 5:15 PM | File | 1 KB |
| INCUND01.PNG | 24-May-18 5:15 PM | PNG image | 3 KB |
| INVCFG01.PNG | 24-May-18 5:15 PM | PNG image | 3 KB |
| INVCFP01.PNG | 24-May-18 5:15 PM | PNG image | 3 KB |
| INVCFP02.PNG | 24-May-18 5:15 PM | PNG image | 4 KB |
| INVUNB01.PNG | 24-May-18 5:15 PM | PNG image | 3 KB |
| MIVCF01.PNG | 24-May-18 5:15 PM | PNG image | 3 KB |
| MIVMDA01.PNG | 24-May-18 5:15 PM | PNG image | 3 KB |
| MIVMDP01.PNG | 24-May-18 5:15 PM | PNG image | 4 KB |
| MIVMPG01.PNG | 24-May-18 5:15 PM | PNG image | 3 KB |
| MIVMPP01.PNG | 24-May-18 5:15 PM | PNG image | 3 KB |
| OUAUNB01.PNG | 24-May-18 5:15 PM | PNG image | 3 KB |
| OUVCF01.PNG | 24-May-18 5:15 PM | PNG image | 3 KB |
| OUVMDA01.PNG | 24-May-18 5:15 PM | PNG image | 3 KB |
| OUVMDP01.PNG | 24-May-18 5:15 PM | PNG image | 3 KB |
| OUVMPG01.PNG | 24-May-18 5:15 PM | PNG image | 3 KB |
| OUVMPP01.PNG | 24-May-18 5:15 PM | PNG image | 4 KB |
| OUVUNB01.PNG | 24-May-18 5:15 PM | PNG image | 3 KB |
| SHFTV01.PNG | 24-May-18 5:15 PM | PNG image | 3 KB |

FIG. 10

USER INTERFACE FOR A TESTING DEVICE CONFIGURED TO GUIDE USER TESTING OF A MOTOR DRIVE AND A MOTOR

BACKGROUND

Technical Field

This application is directed to a user interface (UI) for a motor drive testing device and, in particular, an oscilloscope configured to guide a user in testing a motor drive.

Description of the Related Art

Motor control systems are used in critical processes throughout industrial plants. In a control system, a motor is used to provide mechanical power to a machine, pump, and/or fan, among others. A motor drive can be used to control the energy sent to the motor. By varying voltage levels and frequencies, the motor's speed and torque are controlled. Types of motor drives include a Variable-Frequency Drive (VFD) and Variable Speed Drive (VSD), among others.

BRIEF SUMMARY

In an embodiment, an oscilloscope is provided. The oscilloscope includes one or more probes; an input device; a display; a processor; and memory. The memory is configured to store executable instructions that, when executed by the processor, cause the processor to cause a motor drive stage selection menu to be displayed on the display. The motor drive stage selection menu lists a plurality of motor drive stages. The memory stores executable instructions that cause the processor to receive, via the input device, a selection of a motor drive stage of the plurality of motor drive stages and in response to receiving the selection of the test of the plurality of tests, cause a test selection menu to be displayed on the display, where the test selection menu lists a plurality of tests associated with the motor drive stage of the plurality of motor drive stages. The memory stores executable instructions that cause the processor to receive, via the input device, a selection of a test of the plurality of tests and cause an operational menu associated with the test to be displayed, where the operational menu includes a representation of a connectivity of the one or more probes to the motor drive stage. The memory stores executable instructions that cause the processor to receive, via the input device, an instruction to perform the test, perform the test on the motor drive stage and display a result of the performed test on the motor drive stage.

BRIEF DESCRIPTION OF THE SEVERAL VIEWS OF THE DRAWINGS

FIG. 10 shows a computer directory in which various displayed testing results are saved as images.

DETAILED DESCRIPTION

In an embodiment, a testing device, such as an oscilloscope, includes one or more probes, an input device, such as a keypad or a touchscreen, a display, a processor and memory. The one or more probes, input device, display and memory are communicatively coupled to the processor. The testing device may be reconfigured to perform the operations described herein. The memory may store executable instructions that, when executed by the processor, cause the testing device to operate in the manner described herein.

The testing device may be configured to operate as a dedicated tool for testing motor drives and motor shafts. The testing device may guide a user (such as a test engineer or a technician) through the steps of testing the motor drive and shaft. The testing device is configured to output testing results to the user. By configuring the testing device to output specific motor drive and shaft measurement results and by guiding a user through the steps of performing the measurement, operation of the testing device is simplified. Whereas oscilloscopes generally require advanced electrical engineering knowledge to correctly setup for measurement, operate, and comprehend and analyze the measurement results thereof, guiding the user and preconfiguring the manner in which the measurement results are output and displayed results in rendering an oscilloscope as a user friendly device. As such, any user, whether a technician or a field engineer, who may not have advanced electrical engineering knowledge or may not be knowledgeable enough to configure and operate an oscilloscope, may utilize the oscilloscope, as configured per the embodiments described herein, to test motor drives and shaft.

Figure 1:
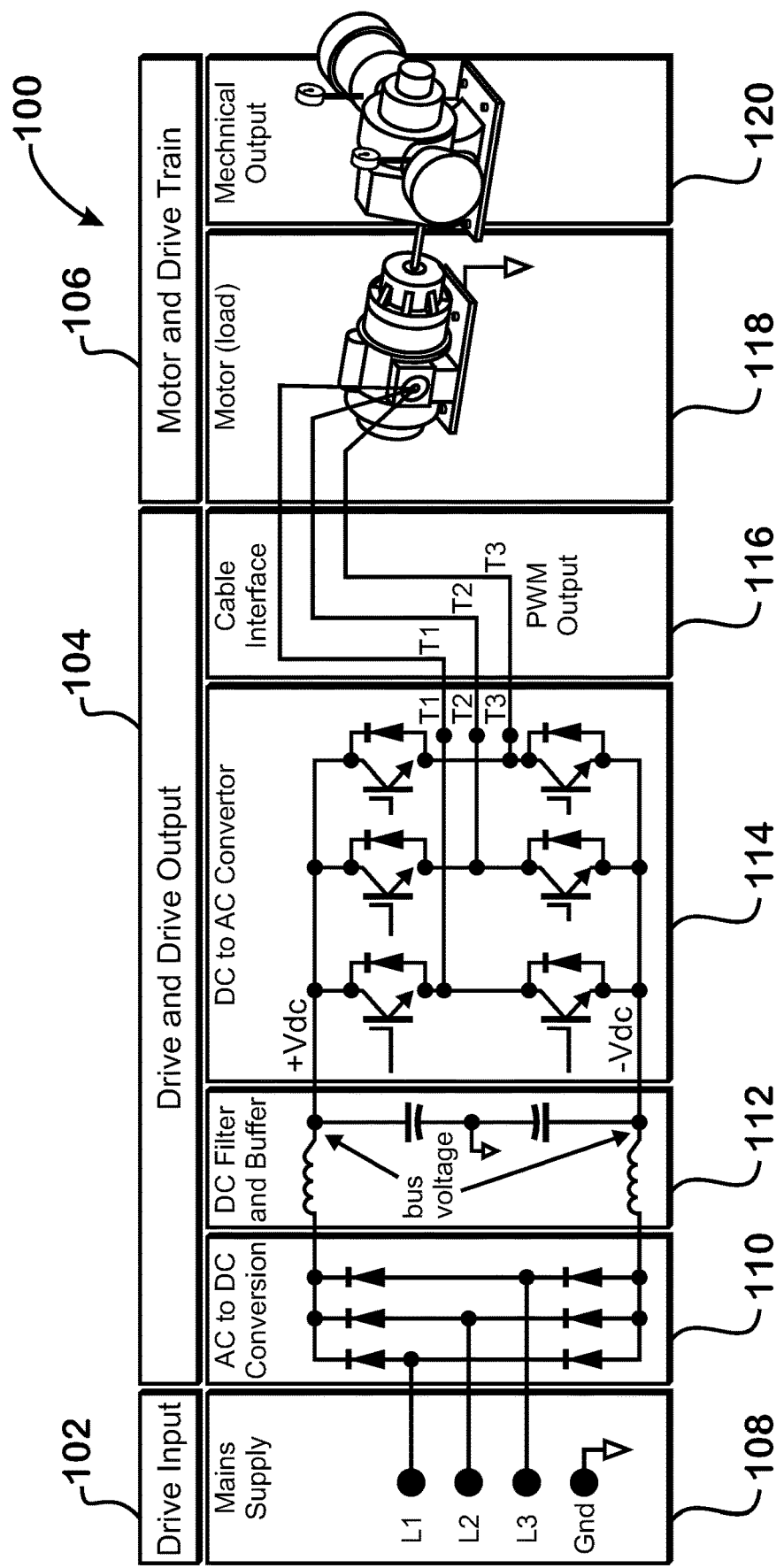
FIG. 1 shows a block diagram of a motor drive system.

FIG. 1 shows a block diagram of a motor drive system 100. The motor drive system 100 is an alternating current (AC) motor drive and includes three stages: a drive input stage 102, a drive stage 104 and a motor and drive train stage 106. The drive input stage includes a mains supply stage 108. The drive stage 104 includes an AC-to-DC (direct current) conversion stage 110, a DC filter/buffer stage 112, a DC-to-AC conversion stage 114, and a cable interface 116. The motor and drive train stage 106 includes a motor 118 and a mechanical output 120.

Electrical energy is provided to the drive stage by a three-phase mains power supply. This AC input is converted by the drive stage into a DC voltage by the AC-to-DC conversion stage. The output of the AC-to-DC conversion stage is filtered or buffered and a DC bus thereof is then provided to the DC-to-AC conversion stage (inverter section). The AC-to-DC conversion stage converts the DC back to an AC signal that uses a voltage modulation to provide the energy to the motor.

An important task for a plant manager and plant personnel is to ensure that these systems are running optimally or at an optimum efficiency. Further, it is important to be able to restore the stages in the event of a breakdown. Different types of testing devices (available from Fluke Corporation) can be used to install, commission, troubleshoot and analyze motors and motor drives. For advanced electrical measurements during operation, the Fluke 190 Series II ScopeMeter is one of the advanced tools that is used by service engineers, technicians and maintenance personnel.

The Fluke 190 Series II ScopeMeter is a handheld device used for service, installation and maintenance. The ScopeMeter is capable of performing a wide variety of advanced electrical measurements on the motor drive and motor. However, it remains challenging for end users to setup correct measurements and even experts may find it time-consuming to do so. Provided herein is a user interface (UI) configuration (and resulting user experience (UX)) for performing advanced measurements on motor drives and motors easily and expeditiously.

With the user interface (UI), the user selects a type of measurement depending on depending on a test point (or a target stage of the testing). Further, the user may receive assistance in understanding the manner in which to connect probes and clamps (e.g., voltage probes and current clamps) in order to make measurements. Further, the testing device (or oscilloscope) automatically sets the configuration required to perform the measurements and show the readings and waveforms for the measurement. The testing device (or oscilloscope) may also interpret the results by providing background information for the selected measurement and generate create report information that can be used to document the results.

Figure 2:
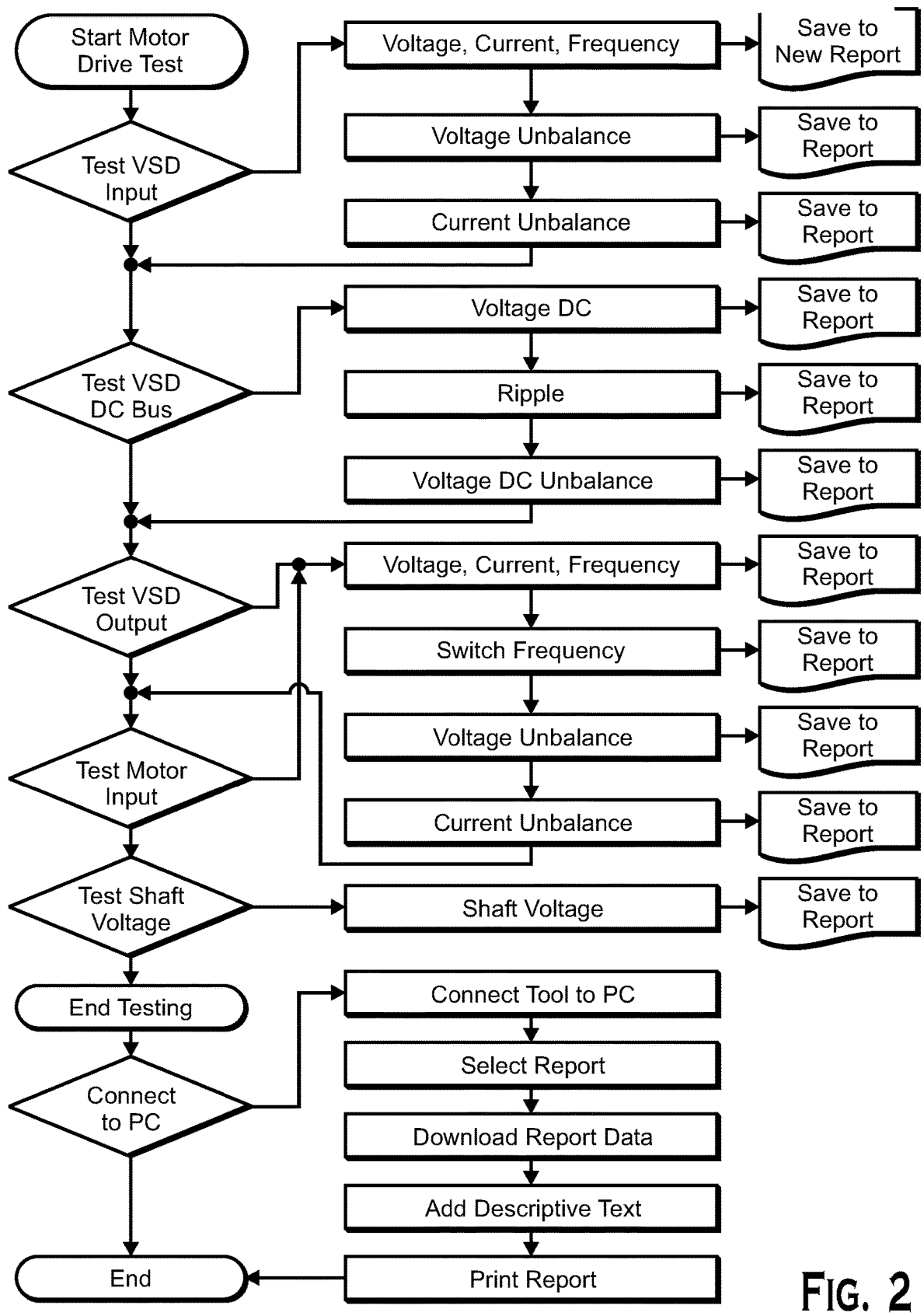
FIG. 2 shows a flow diagram of a method for providing a user interface and testing a motor drive.
Figure 3:
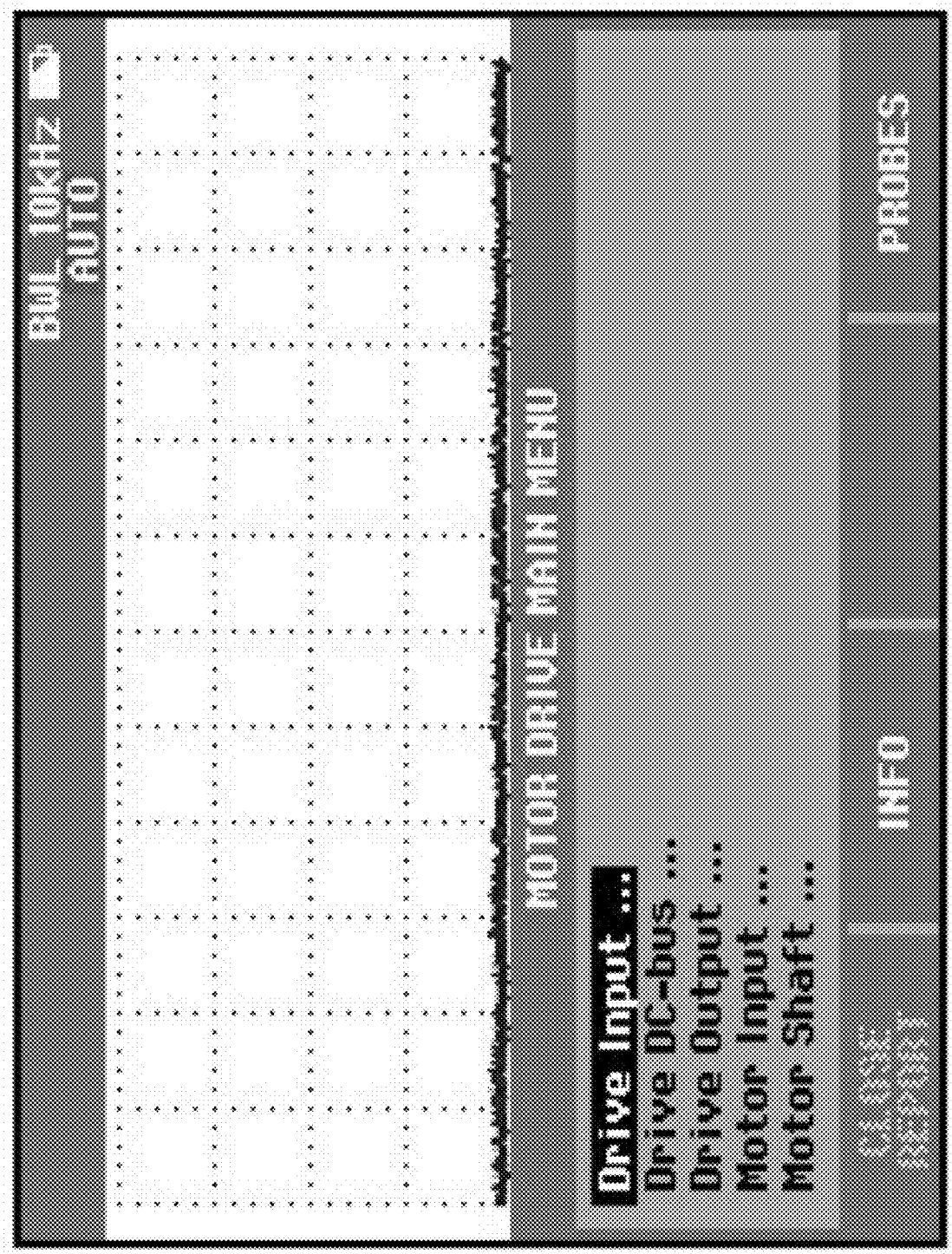
FIG. 3 shows display of a motor drive stage selection menu.

FIG. 2 shows a flow diagram of a method for providing a user interface and testing a motor drive. At the start of the motor drive testing, the testing device, which may be an oscilloscope, presents a motor drive stage selection menu (as shown in FIG. 3). The motor drive stage selection menu offers the user the option of testing various stages of the motor drive.

At each stage, the testing device guides the user in testing the stage and displays the results of the performed measurements. At each stage or test, the testing device displays information relating to items in a menu, a test selection menu, an operational menu and results of the test performed. For example, for the drive input stage, the testing device guides the user through testing the voltage, current and frequency, voltage unbalance and current unbalance. The testing device also guides the user in testing the voltage, ripple and voltage unbalance for the DC bus of the drive stage. The testing device guides the user through testing the voltage, current and frequency, switch frequency, voltage unbalance and current unbalance for the motor drive stage output and the motor input. The testing device guides the user through testing the voltage of the motor shaft.

As shown in FIG. 3, the motor drive stage selection menu lists the drive input stage (three phases of L1, L2 and L3 shown in FIG. 1). The motor drive stage selection menu also lists the motor drive DC bus (+Vdc and −Vdc shown in FIG. 1), the motor drive output (T1, T2 and T3 shown in FIG. 1), the motor input (T1, T2 and T3 as received by the motor to detect incorrectly dimensioned cables, for example) and the motor shaft. Measuring the voltage of the motor shaft (or another electrical metric) may be done by connecting a conductive brush to the motor shaft. The voltage may be displayed and evaluated for the presence of voltage spikes.

Figure 4:
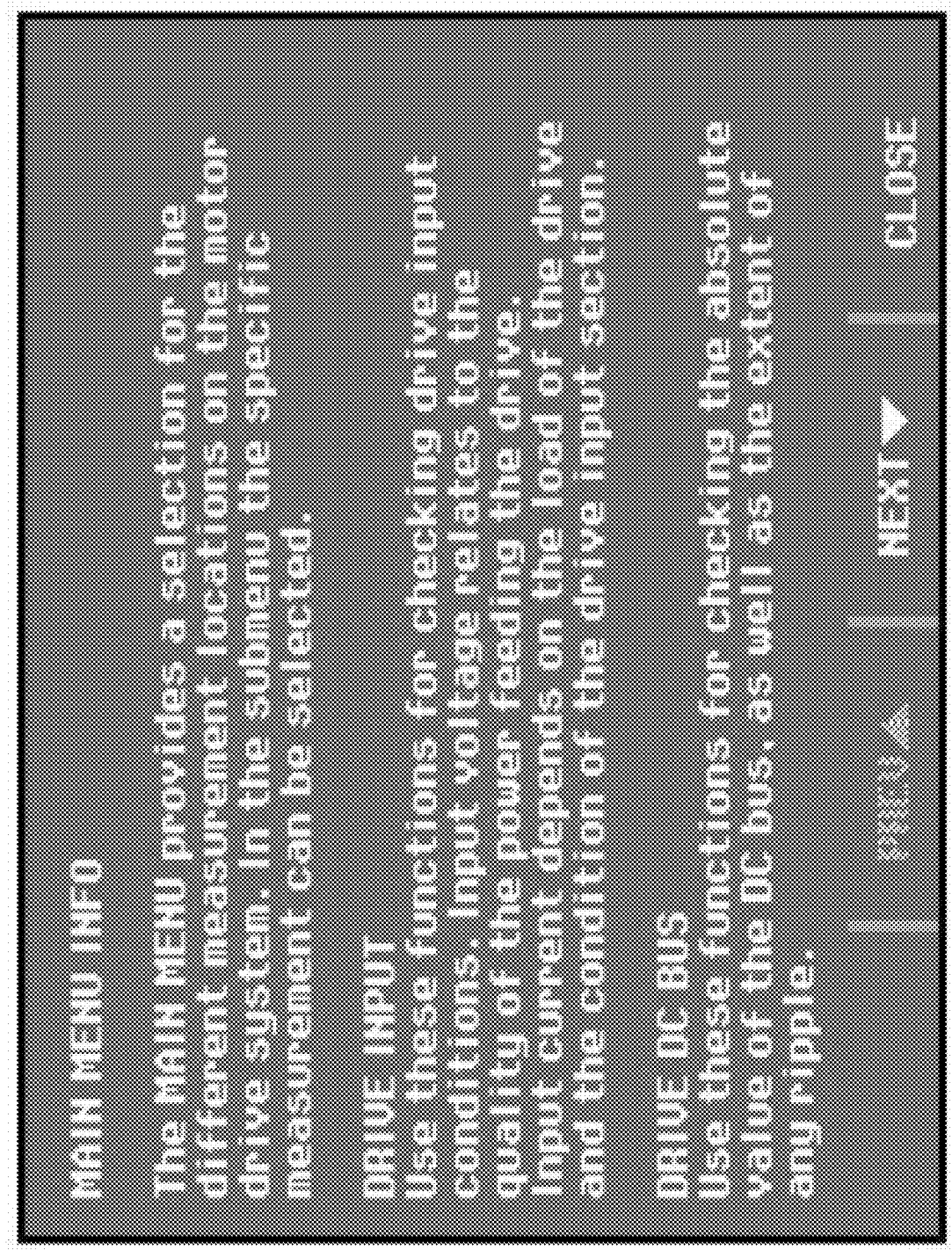
FIG. 4 shows display of information relating to items displayed in the motor drive stage selection menu.

Displaying the motor drive stage selection menu also includes displaying, in a region of the display, an information (or "info") tab. The user may navigate (for example, using an input device) to the information tab and select the information tab. Selection of the information tab triggers display of information relating to items displayed in the motor drive stage selection menu (see FIG. 4). Display of the information includes displaying background information about the measurements made and the interpretation of the measurement results. The information tab may be displayed in other menus described herein. Selection of the information tab triggers the testing device to display information about corresponding tests or results thereof.

Figure 5:
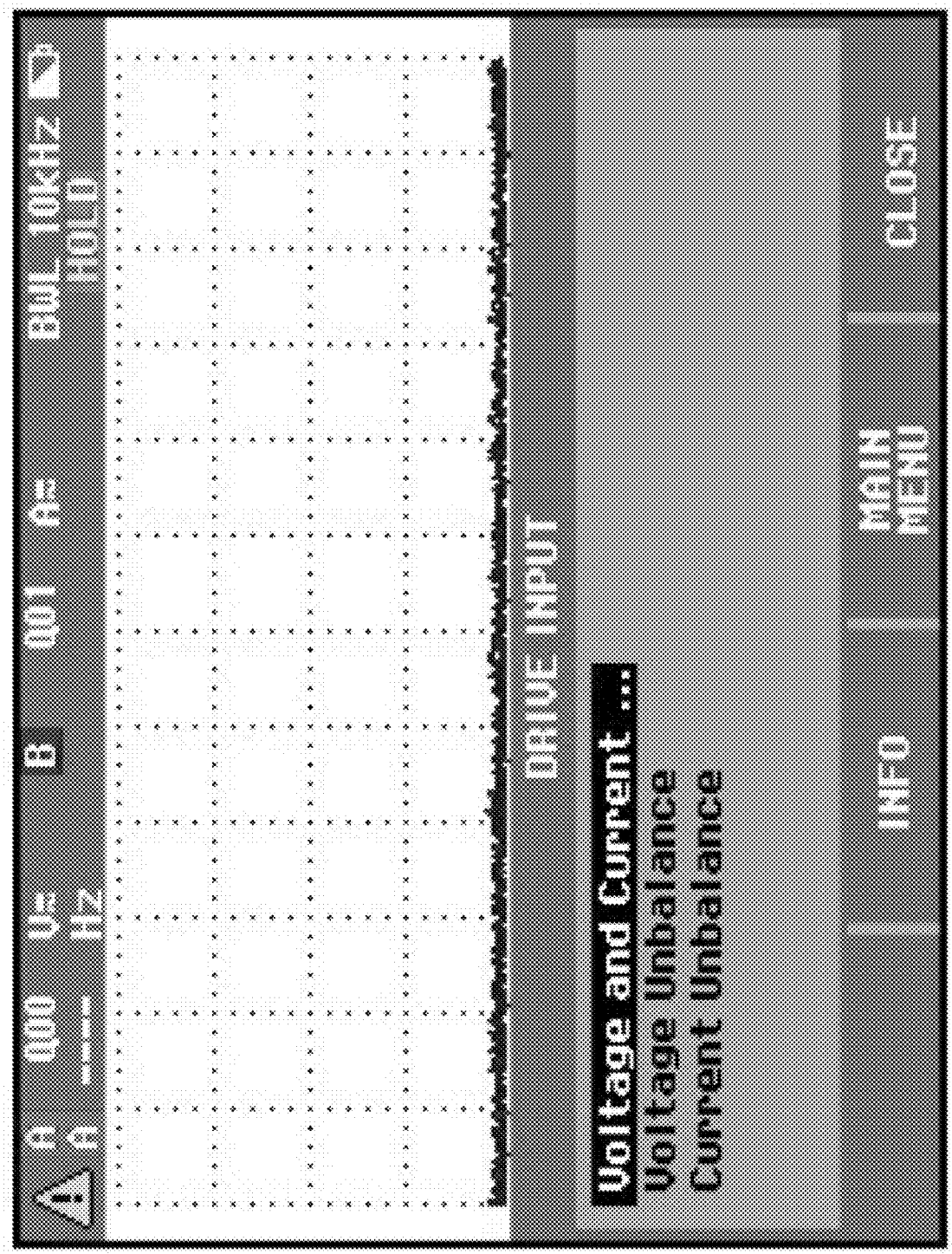
FIG. 5 shows display of a test selection menu.

The motor drive stage selection menu permits a user (for example, technician or engineer) to select using the menu the test to be performed. Alternatively, the user may select that all listed tests be performed. For each motor drive or motor stage, a variety of tests may be performed. In response to the user selecting a stage to be tested using the motor drive stage selection menu, the testing device displays a test selection menu (an example of which is shown in FIG. 5). Selection of a stage may be made by actuating or pressing a button (such as an enter button on the testing device). For each test location (or stage), a number of different tests can be performed that can be selected using the test selection menu (or submenu).

Figure 6:
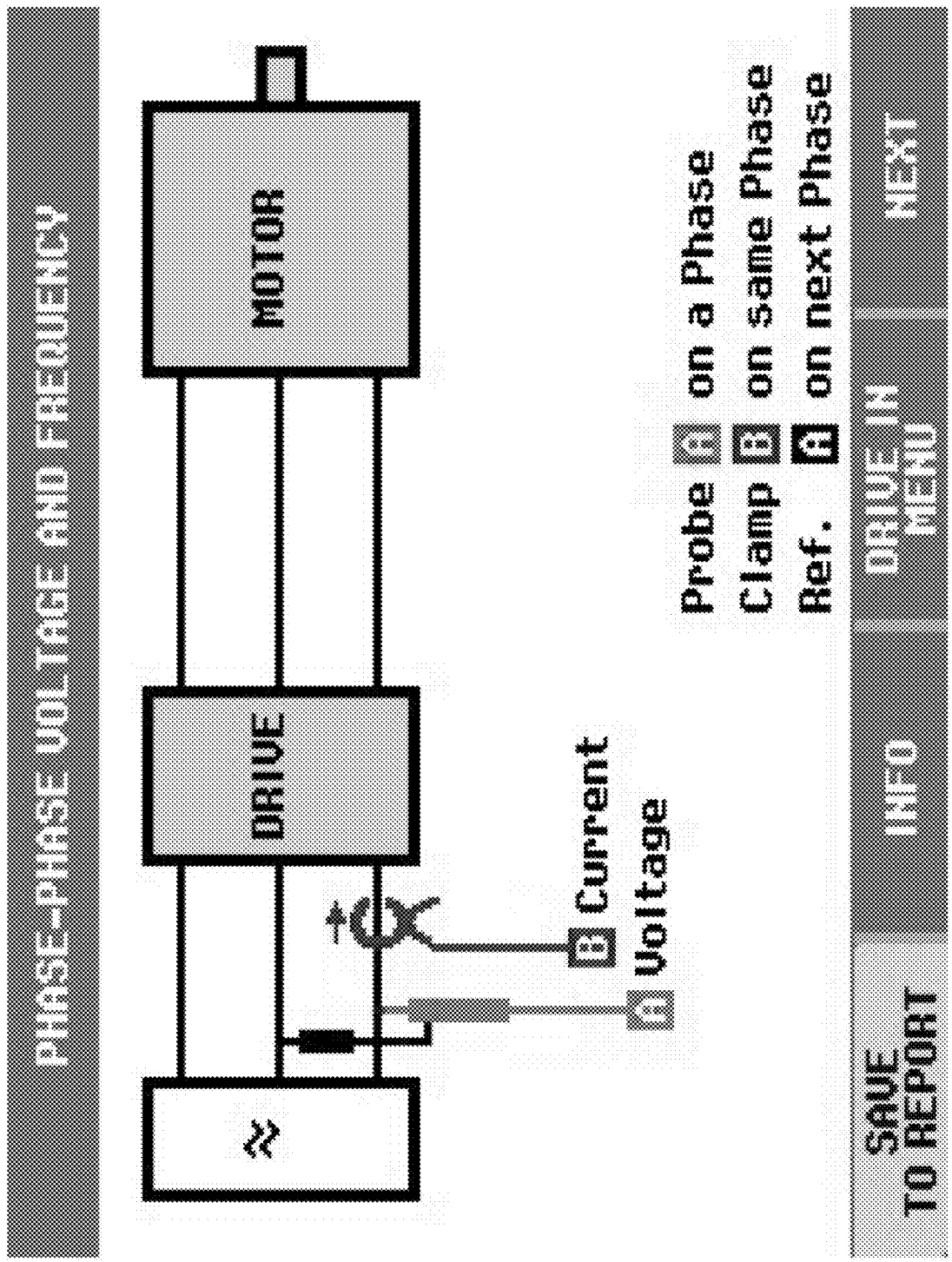
FIG. 6 shows an example of an operational menu.

Each item of the test selection menu represents a specific test that can be performed at the selected test location or stage. To aid the user in correctly operating the testing device to perform make the desired measurement, an operational menu is displayed. FIG. 6 shows an example of an operational menu. The operational menu includes a representation of a connectivity of one or more probes of the testing device to the motor drive stage or to the motor. The operational menu may diagrammatically show how voltage probes and/or current clamps are to be connected.

After the test is performed, the testing device displays waveforms that are acquired at the connection points of the voltage probes and/or current clamps.

Figure 7:
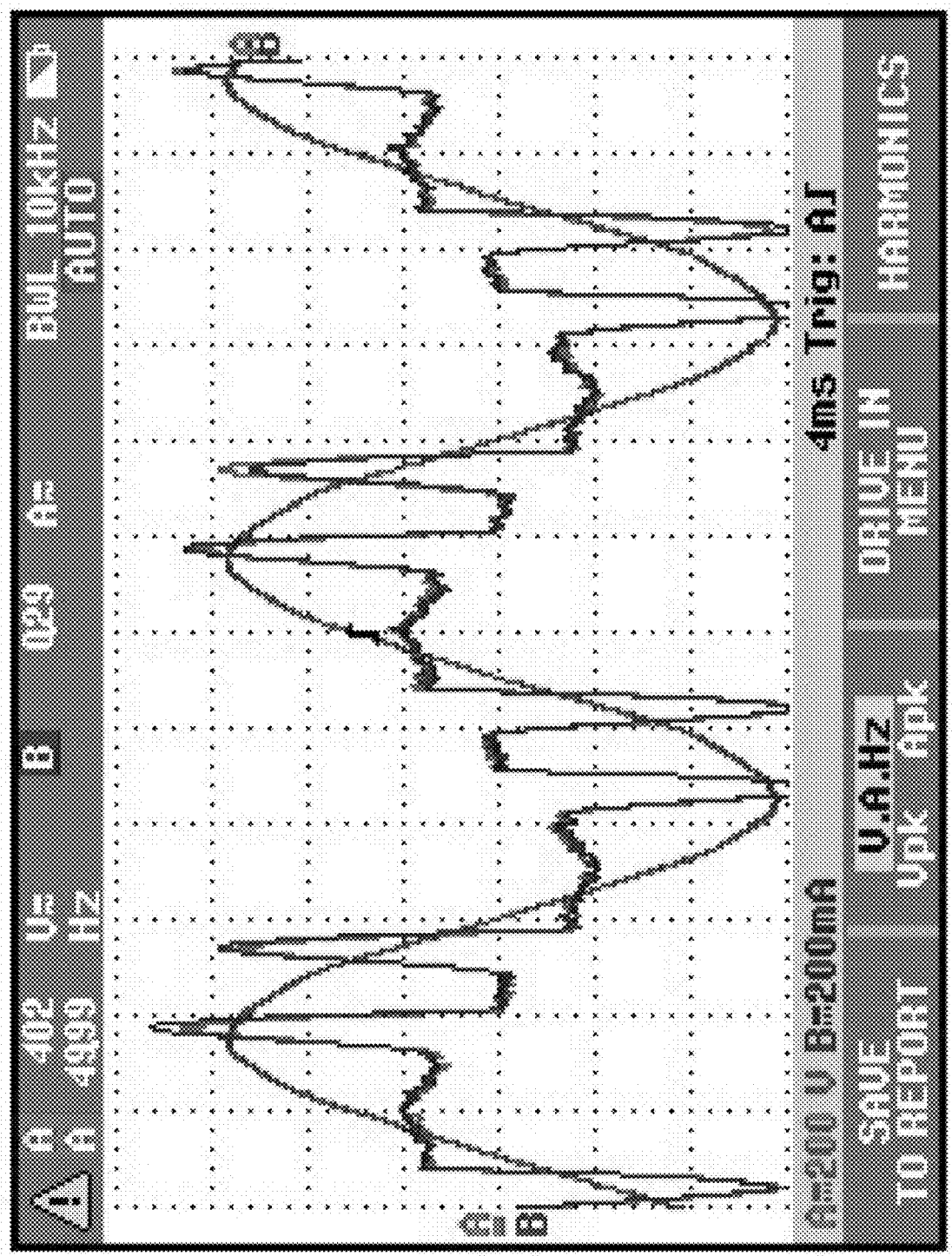
FIG. 7 shows an example of a displayed result of a test performed on the motor drive stage.

FIG. 7 shows an example of a displayed result of a test performed on the motor drive stage. The vertical (attenuation) scales and horizontal (time base) scale may automatically be set to display the most useful information for the user. In addition to the waveform display, the screen automatically shows the measurement readings that are most useful for the selected function.

In FIG. 7, current and voltage waveforms are shown. A key also shows the scale in Volts (V) and milliAmperes (mA) for the voltage and current respectively in the y-axis and the time in milliseconds (ms) for the x-axis. In addition, the measured values for the voltage, frequency and current are also displayed. The measured values for the voltage and current may be root mean squared (RMS) values, among others. The current and voltage waveforms are displayed for approximately 2.5 cycles.

In addition to displaying the measurement results, the testing device also displays an action menu. Displaying the action menu includes displaying in respective regions of the display a tab for saving the measured values to a report, a tab for viewing further information associated with the performed test, such as peak voltage or peak current, a tab for returning to the test selection menu and a tab for viewing the harmonics of the measured parameters. Depending on the tested stage, an analysis function may be selected by the user.

Figure 8:
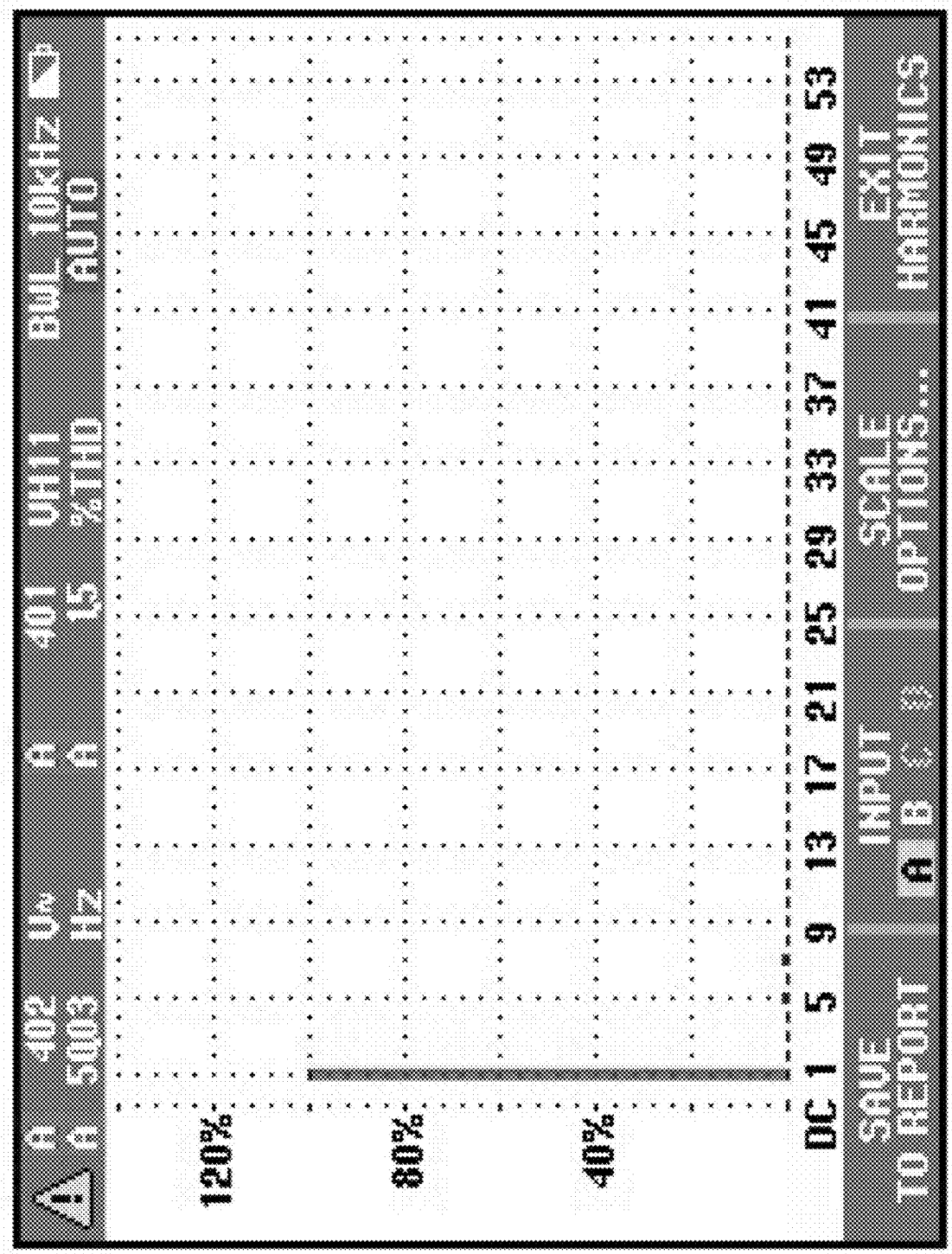
FIG. 8 shows an example of the displayed harmonics for measured voltage.

FIG. 8 shows an example of the displayed harmonics for measured voltage. Although the harmonics of the measured voltage are shown, current harmonics or higher frequency components may also be shown. Motor drives as well as other devices are nonlinear loads. Thus, the voltage and current may not be exact sinusoidal waves of the fundamental frequency but may include harmonics that are multiples of the fundamental frequency. These harmonics can degrade efficiency and cause diverse problems. Displaying the harmonics information allows the user to analyze this aspect of a motor or motor drive.

Figure 9:
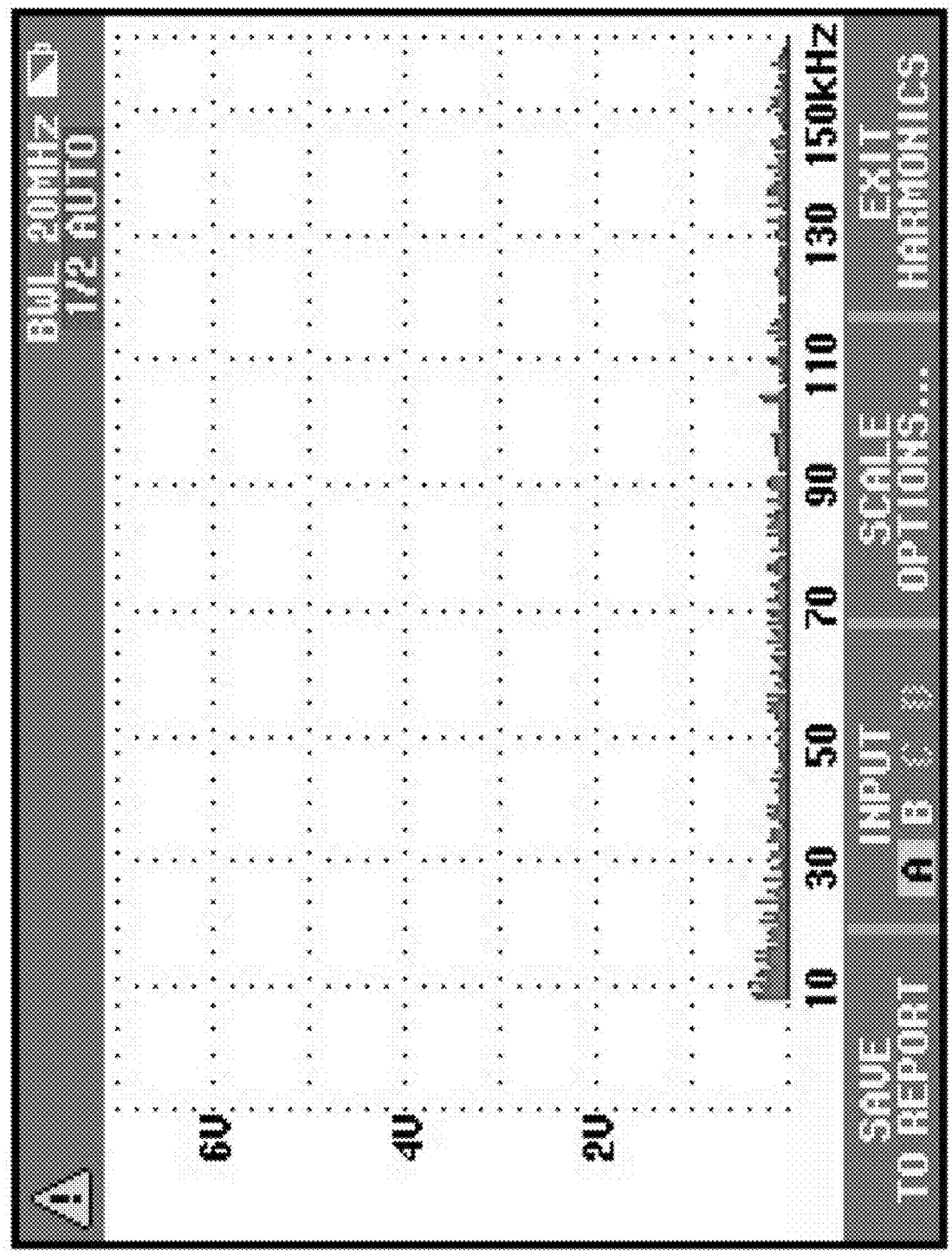
FIG. 9 shows display of a frequency spectrum.

Other higher frequency interferences may also occur that are displayed as a frequency spectrum as shown in FIG. 9. For each performed test, the display displays a "save report" option that allows the user to save the screen to a report to give an overview of all measurements at the selected test location. FIG. 10 shows a computer directory in which various displayed testing results are saved as images. The testing results may be transferred to the computer, phone or other device. The testing results may form a complete report of all the test that are done on the motor drive system.

Figure 11:
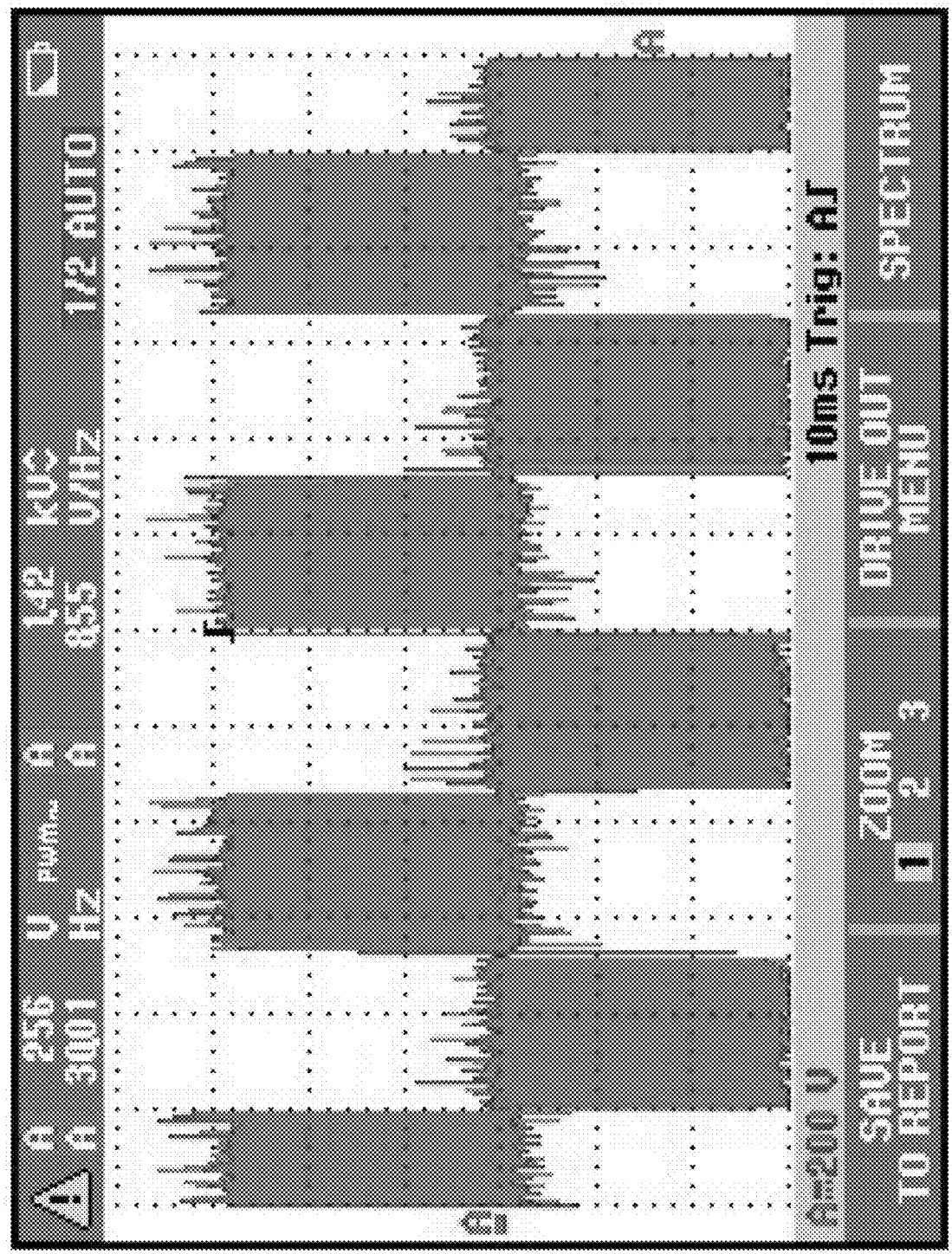
FIG. 11 shows an example of display of a pulse width modulated signal.

The motor drive output voltage is a modulated signal with fast switching between voltage levels. An example pulse width modulated signal is shown in FIG. 11. High energy voltage changes and reflections can cause breakdown of motor winding insulation over time and result in downtime of production or other equipment.

Figure 12:
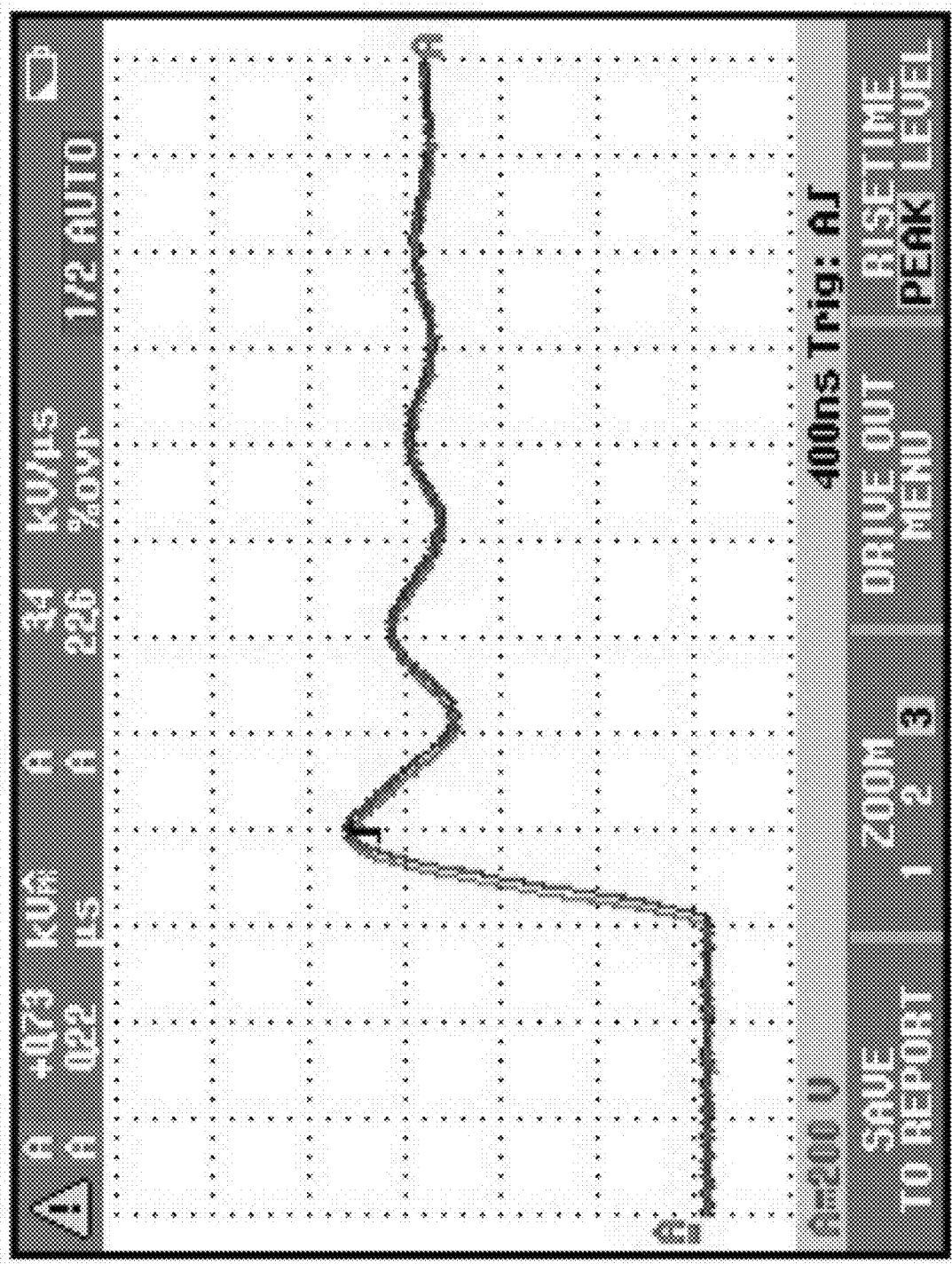
FIG. 12 shows display of a dV/dT measurement used to measure voltage changes.

FIG. 12 shows a dV/dT measurement used to measure voltage changes, dV/dT, the rate of change of voltage over time. dV/dT represents a ratio between voltage difference and time difference for a rising edge when measuring the voltage between two phases. The testing device may be used to zoom in on the waveform by changing the time base. However, as each pulse may have a different rise time, zooming may not result in stable waveform and a readily displayable reading.

A dedicated algorithm may be used to filter the edges based on the rise time. Thus, pulses with a high dV/dT may be shown so that a user may directly identify the measured value and compare it with a maximum value permissible value for the connected motor. Furthermore, measurements of the output of the motor drive may be compared with measurement of the input of the motor to determine the influence or effect of the cable between motor drive and motor. The cable may introduce voltage reflections that are identifiable based on the comparison.

As shown in FIG. 2, after the user is guided through the testing of the motor drive output and the motor input, the user may be guided through the testing of the motor shaft and voltage thereof.

A motor shaft transmits the mechanical power from the motor to the load. Variable frequency drives (VFDs) induce significant voltage onto the shaft of the motor because of high switching frequencies. When the voltage levels exceed the insulating capability of the bearing inner and outer ring, a breakdown of the insulation occurs. This phenomenon is known as electrical discharge machining (EDM).

Repeated fast high voltage discharges will in time lead to damage of the bearing. To detect this phenomenon, an electrical discharge detector may be used. Because the discharge is a fast changing signal, this will also cause a short wide-band RF burst that can be detected with a RF detector. The user may be able to listen to the discharges and count the number of times a discharge occurs but will not be able to determine how critical is the discharge.

Further, a bearing predictor may be used. The bearing predictor measures the voltage on the motor shaft (e.g., using a brush connected to the shaft to electrically connect to the shaft). The number of high voltage changes is counted and the voltages changes are classified as high, medium or low changes depending on the voltage levels.

The fast discharges may be detected and displayed using a testing device (such as an oscilloscope or ScopeMeter). The testing device may give better insight in how severa a pulse is. The testing device described herein may count the number of pulses. The testing device may also display the pulses as waveforms, which allows for a detailed analysis of the voltage of the motor shaft. What is considered (for example, by the user) a detrimental or damaging voltage change can be displayed and counted (for example, as an event).

Figure 13:
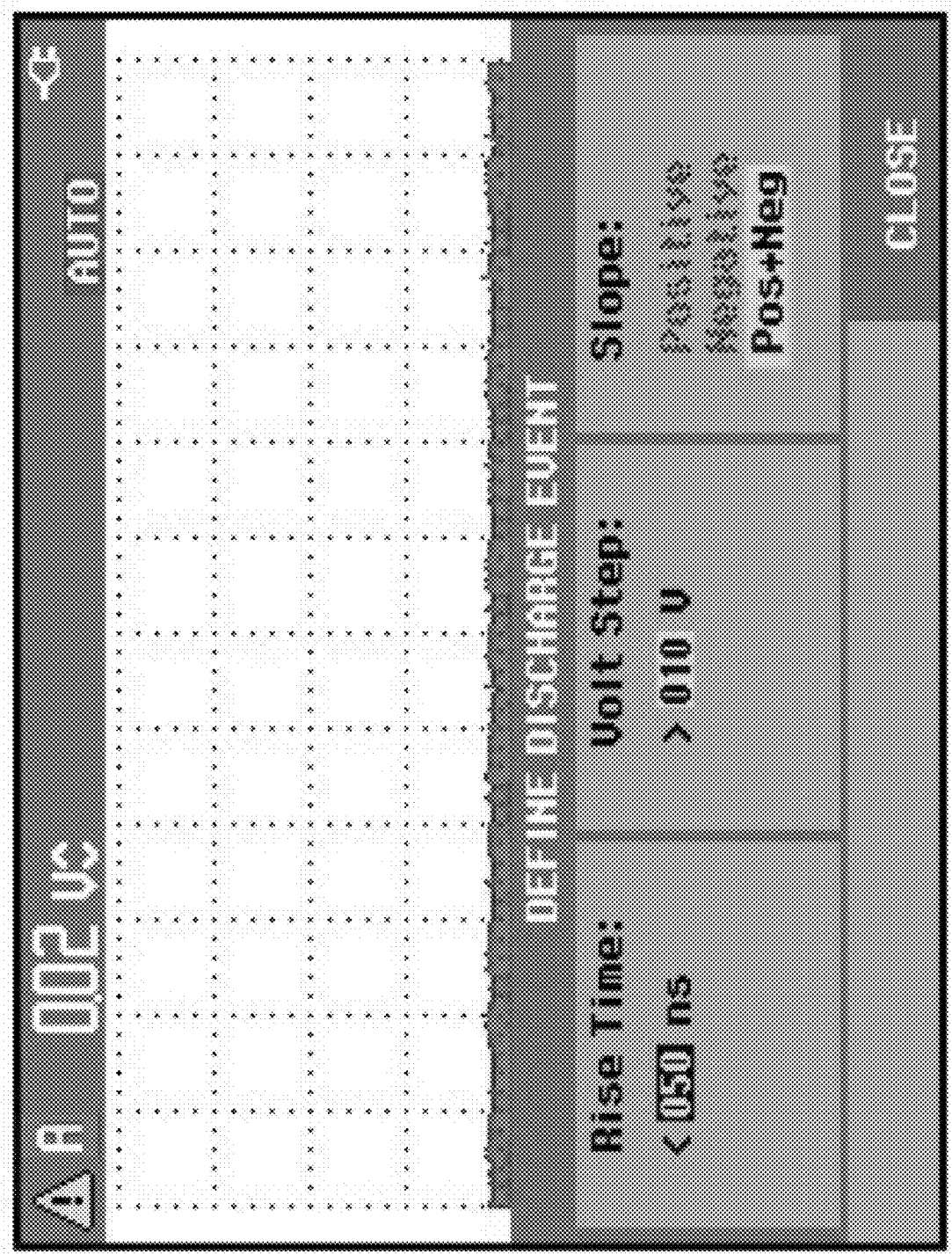
FIG. 13 shows an example of user definition of voltage discharge event.

FIG. 13 shows an example of user definition of a voltage discharge event. The testing device displays fields that may be populated by a user for counting discharge events. The displayed fields include a threshold for a rise time for a voltage discharge and threshold for a voltage step of the discharge event. Furthermore, the user may define whether the identified discharge events are positive-sloped (e.g., voltage increases), negative sloped (e.g., voltage decreases) or both. Using the fields of FIG. 13, the user may specify the maximum rise time and maximum voltage step.

Figure 14:
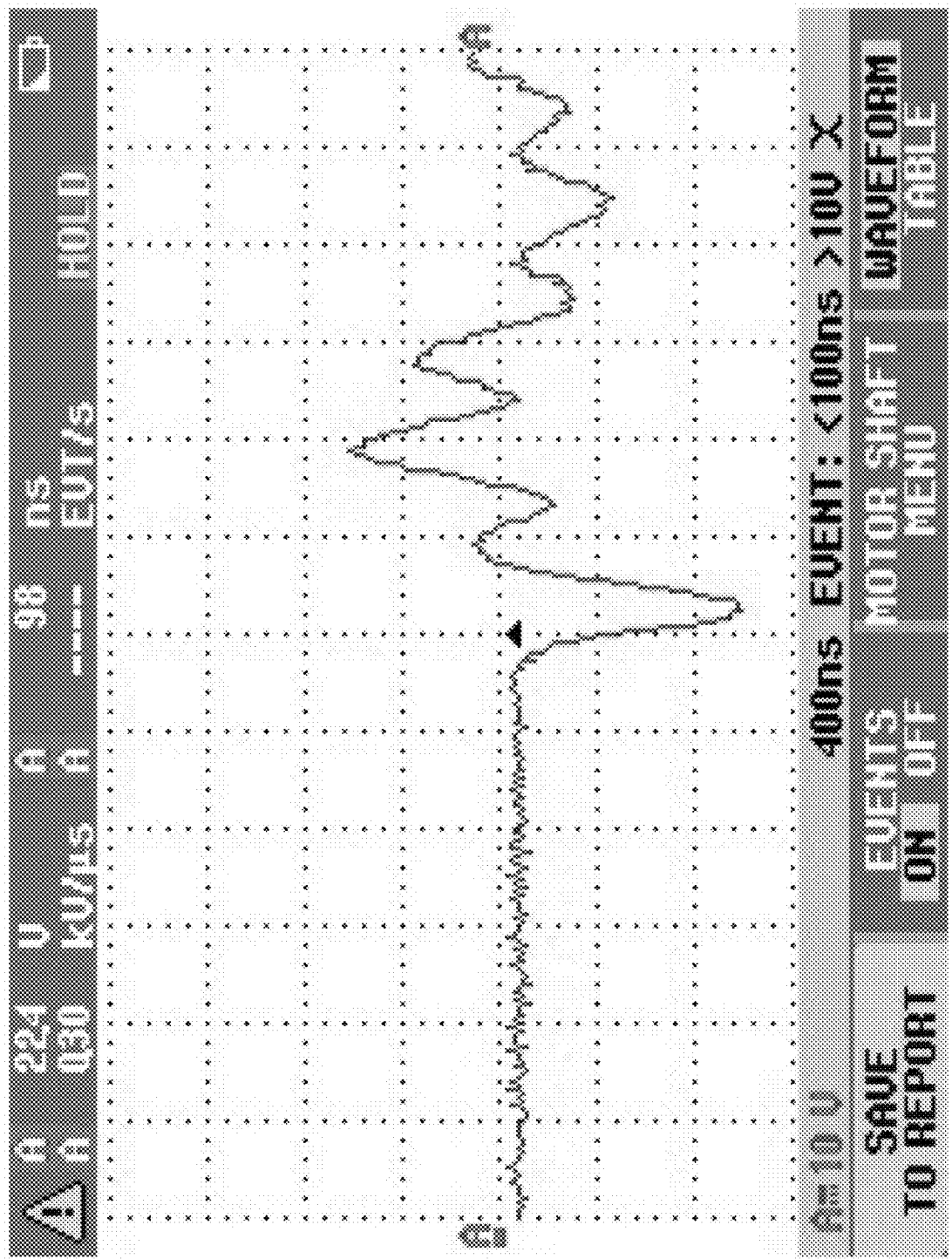
FIG. 14 shows a discharge waveform of motor shaft voltage displayed by the testing device.

FIG. 14 shows a discharge waveform of motor shaft voltage displayed by the testing device. Fast changing pulses are shown as waveforms with corresponding readings.

Figure 15:
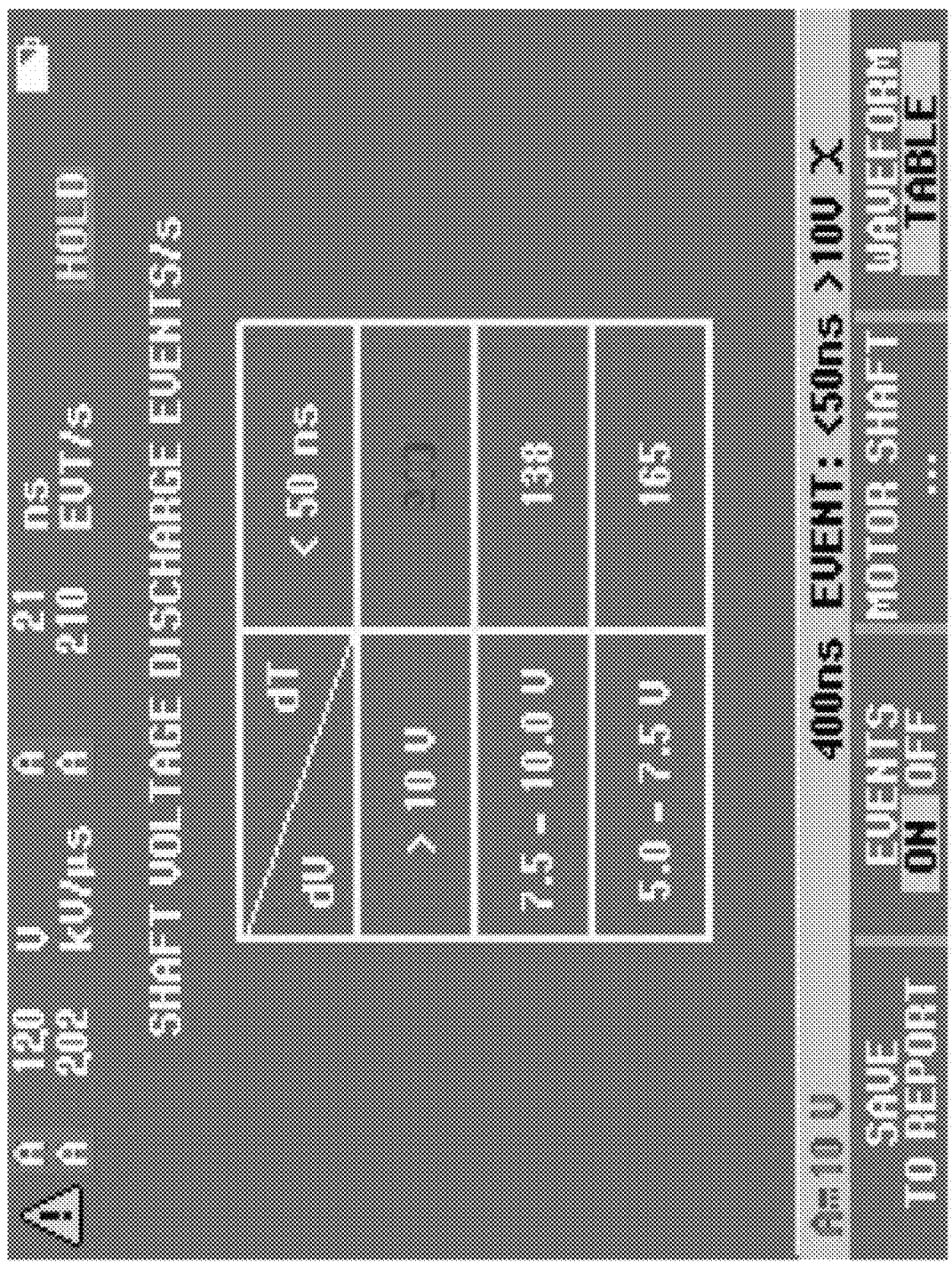
FIG. 15 shows a discharge event counter displayed by the testing device.

FIG. 15 shows a discharge event counter displayed by the testing device. The testing device counts the number of discharge events that meet the criteria defined by the user (FIG. 13) and displays the count to the user. The number of amount of voltage spikes with a fast rise time or fall time is an indicator of the extent to which a bearing is vulnerable or prone to damage.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A scopemeter, comprising:
one or more probes;
an input device;
a display;
a processor; and
memory configured to store executable instructions that, when executed by the processor, cause the processor to:
cause a motor drive stage selection menu to be displayed on the display, the motor drive stage selection menu listing a plurality of motor drive stages;
receive, via the input device, a selection of a motor drive stage of the plurality of motor drive stages;
in response to receiving the selection of the motor drive stage, cause a test selection menu to be displayed on the display, the test selection menu listing a plurality of tests associated with the motor drive stage of the plurality of motor drive stages;
receive, via the input device, a selection of a test of the plurality of tests;
in response to receiving the selection of the test of the plurality of tests, display an operational menu associated with the test, the operational menu including a representation of a connectivity of the one or more probes to the motor drive stage for the test, and the representation including a diagram showing connections to be made by one or more voltage probes or one or more current clamps;
cause the test to be performed on the motor drive stage; and
display a result of the test that is performed on the motor drive stage.

2. The scopemeter of claim 1, wherein the plurality of motor drive stages include at least one of a drive input stage, a drive stage or a motor and drive train stage.

3. The scopemeter of claim 2, wherein the executable instructions cause the processor to:
in response to receiving a selection of the drive input stage:
cause the test selection menu to be displayed including a listing of one or more of: a voltage test, a current test, a frequency test, a voltage unbalance test or a current unbalance test of the drive input stage; and
receive a selection of at least one of: the voltage test, the current test, the frequency test, the voltage unbalance test or the current unbalance test of the drive input stage.

4. The scopemeter of claim 1, wherein the plurality of motor drive stages include at least one of: a drive input stage, a drive direct current (DC) bus stage, a drive output stage, a motor input stage or a motor shaft state.

5. The scopemeter of claim 4, wherein the executable instructions cause the processor to:
in response to receiving a selection of the drive DC bus stage:
cause the test selection menu to be displayed including a listing of one or more of: a voltage test, a ripple test or a voltage unbalance test of the drive DC bus stage;
receive a selection of at least one of: the voltage test, the ripple test or the voltage unbalance test of the drive DC bus stage; and
in response to receiving the selection of the at least one of: the voltage test, the ripple test or the voltage unbalance test of the drive DC bus stage, cause the at least one of: the voltage test, the ripple test or the voltage unbalance test of the drive DC bus stage to be performed on the drive DC bus stage.

6. The scopemeter of claim 1, wherein:
the motor drive stage selection menu includes an information tab, and
the executable instructions cause the processor to:
receive user selection of the information tab; and
in response to receiving the user selection of the information tab, display information associated with items displayed in the motor drive stage selection menu.

7. The scopemeter of claim 1, wherein the executable instructions cause the processor to save a report including the result of the test that is performed on the motor drive stage in the memory or transfer the report to a separate device.

8. A method, comprising:
causing a motor drive stage selection menu to be displayed on a display, the motor drive stage selection menu listing a plurality of motor drive stages;
receiving, via an input device, a selection of a motor drive stage of the plurality of motor drive stages;
in response to receiving the selection of the motor drive stage, causing a test selection menu to be displayed on the display, the test selection menu listing a plurality of tests associated with the motor drive stage of the plurality of motor drive stages;
receiving, via the input device, a selection of a test of the plurality of tests;
in response to receiving the selection of the test of the plurality of tests, displaying an operational menu associated with the test, the operational menu including a representation of a connectivity of the one or more probes to the motor drive stage for the test, and the representation including a diagram showing connections to be made by one or more voltage probes or one or more current clamps;
causing the test to be performed on the motor drive stage; and
displaying a result of the test that is performed on the motor drive stage.

9. The method of claim 8, wherein the plurality of motor drive stages include at least one of a drive input stage, a drive stage or a motor and drive train stage.

10. The method of claim 9, comprising:
in response to receiving a selection of the drive input stage:
causing the test selection menu to be displayed including a listing of one or more of: a voltage test, a current test, a frequency test, a voltage unbalance test or a current unbalance test of the drive input stage;
receiving a selection of at least one of: the voltage test, the current test, the frequency test, the voltage unbalance test or the current unbalance test of the drive input stage; and
in response to receiving the selection of the at least one of: the voltage test, the current test, the frequency test, the voltage unbalance test or the current unbalance test of the drive input stage, causing the at least one of: the voltage test, the current test, the frequency test, the voltage unbalance test or the current unbalance test of the drive input stage to be performed on the drive input stage.

11. The method of claim 8, wherein the plurality of motor drive stages include at least one of: a drive input stage, a drive direct current (DC) bus stage, a drive output stage, a motor input stage or a motor shaft state.

12. The method of claim 11, comprising:
in response to receiving a selection of the drive DC bus stage:
causing the test selection menu to be displayed including a listing of one or more of: a voltage test, a ripple test or a voltage unbalance test of the drive DC bus stage;
receiving a selection of at least one of: the voltage test, the ripple test or the voltage unbalance test of the drive DC bus stage; and
in response to receiving the selection of the at least one of: the voltage test, the ripple test or the voltage unbalance test of the drive DC bus stage, causing the at least one of: the voltage test, the ripple test or the voltage unbalance test of the drive DC bus stage to be performed on the drive DC bus stage.

13. The method of claim 8, wherein:
the motor drive stage selection menu includes an information tab, and
the method includes:
receiving user selection of the information tab; and
in response to receiving the user selection of the information tab, displaying information associated with items displayed in the motor drive stage selection menu.

14. The method of claim 8, comprising:
saving a report including the result of the test that is performed on the motor drive stage or transferring the report to a separate device.

15. A scopemeter, comprising:
one or more probes;
an input device;
a display; and
a processor configured to:
- cause a motor drive stage selection menu to be displayed on the display, the motor drive stage selection menu listing a plurality of motor drive stages;
- receive, via the input device, a selection of a motor drive stage of the plurality of motor drive stages;
- in response to receiving the selection of the motor drive stage, cause a test selection menu to be displayed on the display, the test selection menu listing a plurality of tests associated with the motor drive stage of the plurality of motor drive stages;
- receive, via the input device, a selection of a test of the plurality of tests;
- in response to receiving the selection of the test of the plurality of tests, display an operational menu associated with the test, the operational menu including a representation of a connectivity of the one or more probes to the motor drive stage for the test, and the representation including a diagram showing connections to be made by one or more voltage probes or one or more current clamps;
- cause the test to be performed on the motor drive stage; and
- display a result of the test that is performed on the motor drive stage.

* * * * *